United States Patent [19]

Shindo et al.

[11] Patent Number: 5,096,081
[45] Date of Patent: Mar. 17, 1992

[54] COVER PLATE FOR SEMICONDUCTOR DEVICES

[75] Inventors: Masamichi Shindo; Toshiharu Sakurai; Hideo Taguchi; Nobu Izawa, all of Yokohama, Japan

[73] Assignee: Kabushiki Kaisha Toshiba, Kawasaki, Japan

[21] Appl. No.: 313,555

[22] Filed: Feb. 22, 1989

[30] Foreign Application Priority Data

Feb. 22, 1988 [JP] Japan .................. 63-39035

[51] Int. Cl.$^5$ .................................... H01L 23/04
[52] U.S. Cl. .................................... 220/200; 174/52.4
[58] Field of Search .................. 220/71, 200, 359; 206/328, 461; 174/52.3, 52.4

[56] References Cited

U.S. PATENT DOCUMENTS

| 3,211,503 | 10/1965 | Barnes ................. 206/328 X |
| 3,327,896 | 6/1967 | Asenbauer ............. 220/71 X |
| 4,109,818 | 8/1978 | Hascoe et al. ......... 220/200 |
| 4,126,758 | 11/1978 | Krumme ............... 174/52 FP |
| 4,291,815 | 9/1981 | Gordon et al. ......... 220/200 |
| 4,331,253 | 5/1982 | Gordon et al. ......... 220/200 |
| 4,450,959 | 5/1984 | Sommer ............... 206/461 X |
| 4,604,495 | 8/1986 | Watanabe et al. ....... 174/52 FP |
| 4,640,436 | 2/1987 | Miyoshi et al. ........ 220/359 |
| 4,640,438 | 2/1987 | Trevison et al. ....... 220/359 |
| 4,746,583 | 5/1988 | Falange ............... 220/200 X |

FOREIGN PATENT DOCUMENTS

| 0154757 | 9/1985 | European Pat. Off. . |
| 57-48250 | 3/1982 | Japan . |
| 59-201446 | 11/1984 | Japan . |
| 62-26846 | 2/1987 | Japan . |
| 1484177 | 9/1977 | United Kingdom . |

Primary Examiner—Stephen Marcus
Assistant Examiner—Nova Stucker
Attorney, Agent, or Firm—Foley & Lardner

[57] ABSTRACT

A metal cover plate for covering a semiconductor chip mounted on a package base plate comprises an upper central portion, a flange extending outwardly from outer edges of the central portion, and a side wall portion extending perpendicularly from the flange along all sides thereof. The central portion has at least one portion in parallel with the package base plate. The central portion is formed with reinforcing portions in the form ridges of gable roofs and valleys in cross section, formed along diagonal lines of the central portion or in the form of a ridge or rib substantially semicircular in cross section extending upwardly or downwardly along each diagonal line. Deflection of the top wall portion of the package during pressure application is thus be minimized.

4 Claims, 3 Drawing Sheets

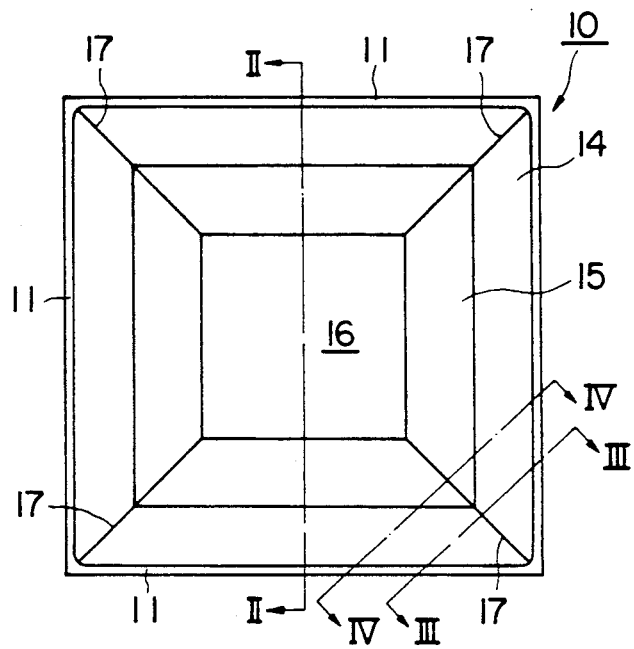
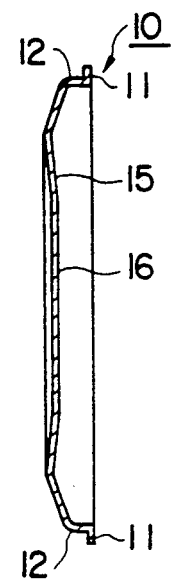
FIG. 1
FIG. 2
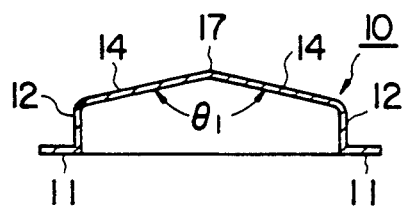
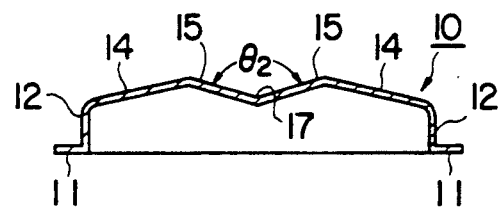
FIG. 3
FIG. 4

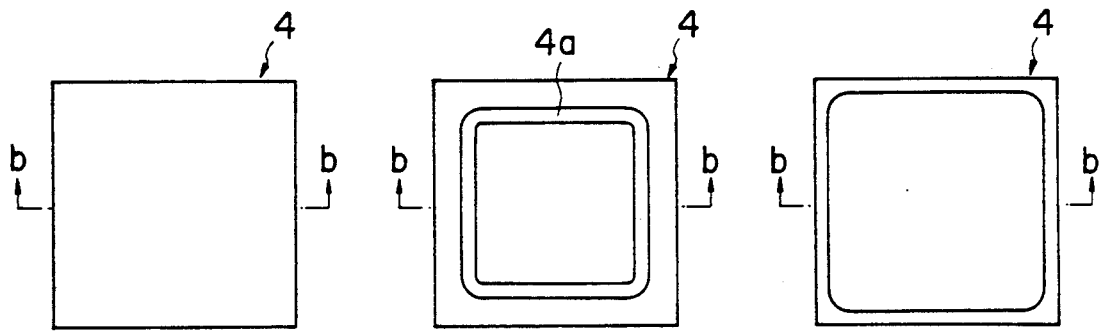
FIG.10a
PRIOR ART
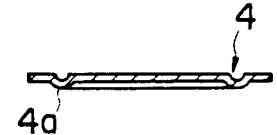
FIG.11a
PRIOR ART
FIG.12a
PRIOR ART
FIG.10b
PRIOR ART
FIG.11b
PRIOR ART
FIG.12b
PRIOR ART
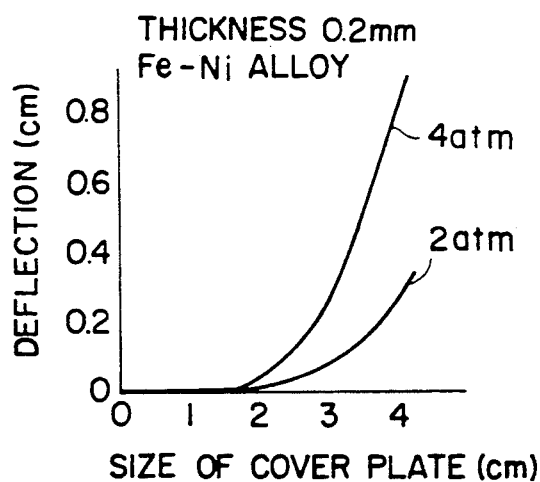
FIG. 13

COVER PLATE FOR SEMICONDUCTOR DEVICES

BACKGROUND OF THE INVENTION
1. Technical Field

The present invention relates to cover plates for semiconductor devices and more particularly to air tight cover plates especially adapted for use as peripheral casings of packages for semiconductor devices with a high data-packaging density such as LSIs.

2. Prior Art

Until recently, the packages for semiconductor devices had been made of ceramics and plastics, but recently in their place metal cover plates have been also used. FIG. 8 illustrates a conventional cover plate of this type. A semiconductor chip 2 is mounted in a center recess of a package base 1 and is electrically connected through bonding wires 3 to wiring leads. The upper portion of the semiconductor chip 2 is hermetically sealed by a cover plate 4 which is in the form of a flat plate as shown in FIG. 10 or is a flat plate which is locally formed with a furrow-shaped reinforcing rib 4a as shown in FIG. 11. In another example of the conventional cover plates shown in FIG. 9, the cover plate 4 is not in the form of one flat plate, but its whole peripheral portion is bent at a right angle so as to define a cap-shaped cover plate 4.

Such air-tight packages are subjected to an He leakage test before they are actually used and are pressurized in an atmosphere of at least twice atmospheric pressure. When the metal covers are pressurized, the metal cover plates 4 are forced to be deformed arcuately in cross section under a pressure P as shown in FIGS. 8 and 9. The relation between the pressure applied to the cover plate and the deflection thereof will be described with reference to FIG. 13. In experiments, the cover plates were made of an Fe-N alloy 0.2 mm in thickness, and the maximum deflections at the center portion of each cover plate in atmospheres of twice and four-times atmospheric pressure were investigated. As is clear from the curves shown in FIG. 13, the larger the size of the cover plate, the greater the deflection.

When the deflection becomes too high, the cover plate 4 is forced to contact the semiconductor chip 2 or bonding wires 3 within the cover plate 4, causing malfunctioning of the chip 2.

SUMMARY OF THE INVENTION

Accordingly, an object of the present invention is to provide cover plates for semiconductor devices whose top portion is locally reinforced so that deflection resulting from the application of external force over the cover plate can be reduced to a minimum.

To the above and other ends, in a metal cover plate which covers a semiconductor chip mounted on a package base, according to the present invention, the cover plate consists of a top wall portion in the form of a rectangle and side wall portions bent along the entire periphery of the rectangular top wall portion. Reinforcing portions are defined along the diagonal lines of the top wall portion.

According to the present invention, therefore, since the reinforcing projected and recessed portions are defined along the diagonal lines of the metal cover plate, the bending strength at such reinforcing portions is increased, so that the deflection due to the application of external force to the metal cover plate can be reduced to a minimum.

BRIEF DESCRIPTION OF THE ACCOMPANYING DRAWINGS

FIG. 1 is a plan view of a semiconductor device in accordance with the present invention;

FIG. 2 is a sectional view taken along the line II—II in FIG. 1;

FIG. 3 is also a sectional view taken along the line III—III in FIG. 1;

FIG. 4 is a sectional view taken along the line IV—IV in FIG. 1;

Figure 5:
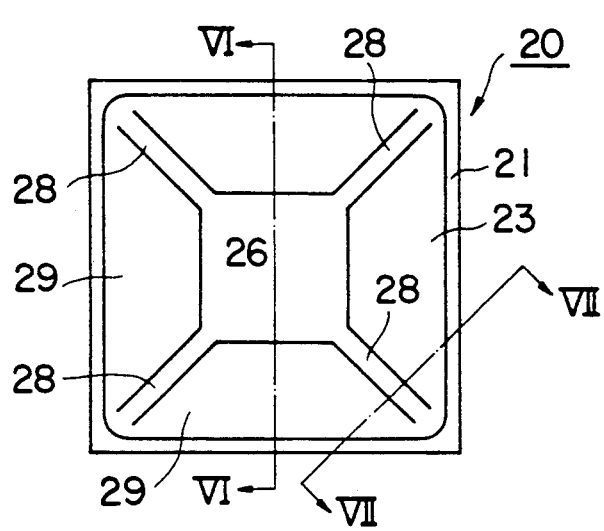
FIG. 5 is a plan view illustrating another embodiment of a cover plate in accordance with the present invention.

FIGS. 10($a$), 11($a$) and 12($a$) are top views illustrating conventional covers, respectively;

FIGS. 10($b$), 11($b$) and 12($b$) are sectional views thereof, respectively, taken along the line b—b of FIGS. 10($a$), 11($a$) and 12($a$), respectively;

FIG. 13 is a graph indicating the relationship between the size of a cover and the maximum deflection thereof when an external force is applied to the cover.

DESCRIPTION OF THE PREFERRED EMBODIMENTS

Now referring to FIGS. 1 to 7, a first and a second preferred embodiment of a cover plate for semiconductor devices in accordance with the present invention will be described in detail hereinbelow.

First Embodiment, FIGS. 1 to 4

Referring first to FIGS. 1 to 4, in a first embodiment a cover plate 10 is made of an Fe-Ni alloy and consists of an outermost flange portion 11, a side wall portion 12 extended substantially perpendicularly from the flange portion 11 and a center top portion 13 formed integrally with the side wall portion 12.

The cover plate 10 covers the upper portion of the semiconductor chip 2 air-tightly, and the center top portion 13 is extended substantially in parallel with the upper surface of the semiconductor chip 2.

The center top portion 13 consists of an outer region 14, an intermediate region 15 and an inner region 16. The outer region 14 is upwardly inclined at a relatively small gradient toward the center of the cover plate 10 while the intermediate region 15 is downwardly inclined inwardly, and the inner region 16 is a flat surface substantially in parallel with the package base. As best shown in FIG. 3, both the surfaces extended in the opposite directions from the diagonal line 17 intersect each other at an angle of intersection $\Theta_1$ and define a roof-ridge-like portion. As best shown in FIG. 4, both of the surfaces 15 extended from the diagonal line 17 in opposite directions, respectively, intersect each other at an angle of intersection $\Theta_2$ and define a valley portion.

With the above-described construction, the total of four roof-ridge-like portions and valley-like portions are defined along the diagonal line of the center top portion 13, such that the bending strength or the rigidity, against bending force is increased by the roof-ridge-like portions and the valley-like portions. As a result, the deflection of the metal cover plate 10 due to an external force applied thereto can be reduced to a minimum.

According to the results of experiments we have conducted, when a cover plate was made of a Fe-Ni alloy plate 0.2 mm in thickness in the form of a square, each side being 40 mm in length, and the metal cover plate was spaced apart from the center of a semiconductor chip 2 by 0.2 mm and was subjected to a pressure of two atmospheres, it was confirmed that the undersurface of the metal cover plate was not forced to contact the bonding wires of the chip.

Figure 6:
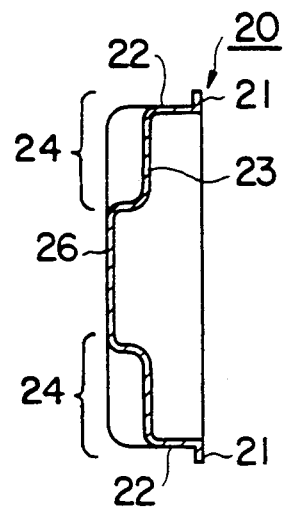
FIG. 6 is a sectional view taken along the line VI—VI in FIG. 5.
Figure 7:
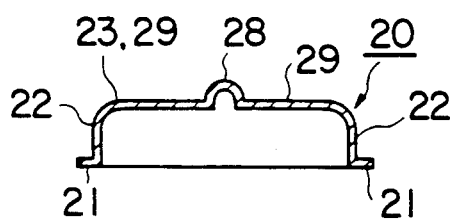
FIG. 7 is a sectional view taken along the line VII—VII in FIG. 5.
Figure 8:
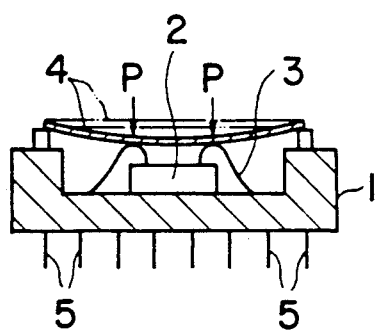
FIG. 8 is a sectional view illustrating a conventional semiconductor package.
Figure 9:
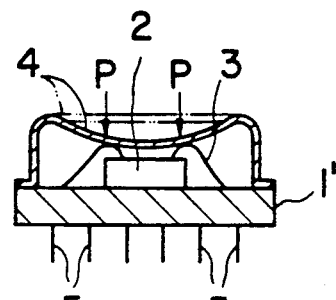
FIG. 9 is a sectional view illustrating another conventional semiconductor package.

Second Embodiment, FIGS. 5, 6, and 7

Referring next to FIGS. 5, 6, and 7, a second embodiment of the present invention will now be described. A cover plate 20 made of an Fe-Ni alloy consists of an outermost peripheral flange portion 21, a side wall portion 22 extended substantially perpendicularly from the flange portion 21, and a central top portion 23 formed integrally with the upright side wall portion 22.

As in the first embodiment of the invention described above, the metal cover plate covers and hermetically seals the upper portion of a semiconductor chip 2.

The top portion 23 consists of an outer region 24 and an inner region 26, and reinforcing ribs 28 are defined along the diagonal lines of the outer region 24. As best shown in FIG. 7, each rib 28 is semicircular in cross section and is extended upwardly such that level land portions 29, which are lower than the ribs 28, are defined between the adjacent ribs 28.

In the second embodiment of the invention, the ribs 28 have been described as being extended upwardly, but it is understood that they may be extended downwardly or inwardly.

What is claimed is:

1. A metal cover plate for covering a semiconductor chip mounted on a package base plate of a semiconductor device, said cover plate comprising:
   A rectangular top wall portion and a side wall portion bent along the entire periphery of said cover plate, and
   reinforcing portions located along diagonal lines of said top wall portion, wherein:
      said top wall portion includes an outer region, an intermediate region and an inner region which surround the center of said top wall portion and which have centers coinciding with the center of said top wall portion;
      said inner region is in the form of a flat surface substantially parallel to said package base plate; and
      said outer region is inclined upwardly toward the center of said top wall portion and said intermediate region is inclined downwardly towards the center of said top wall portion.

2. A metal cover plate for covering a semiconductor chip mounted on a package base plate of a semiconductor device, said cover plate comprising:
   a rectangular top wall portion and a side wall portion bent along the entire periphery of said cover plate, and
   reinforcing portions located along diagonal lines of said top wall portion, wherein said reinforcing portions are in the form of a ridge of a gable roof and a valley defined by tapered surfaces extending from said diagonal lines in opposite directions.

3. A semiconductor assembly comprising:
   a semiconductor chip mounted on a package base plate of a semiconductor device; and
   a cover plate which includes a rectangular top wall portion and a side wall portion bent along the entire periphery of said cover plate and reinforcing portions located along diagonal lines of said top wall portion, wherein:
   said top wall portion includes an outer region, an intermediate region and an inner region which surround the center of said top wall portion and which have centers coinciding with the center of said top wall portion;
   said inner region is in the form of a flat surface substantially parallel to said package base plate; and
   said outer region is inclined upwardly towards the center of said top wall portion and said intermediate region is inclined downwardly towards the center of said top wall portion.

4. A semiconductor assembly comprising:
   a semiconductor chip mounted on a package base plate of a semiconductor device; and
   a cover plate which includes a rectangular top wall portion and a side wall portion bent along the entire periphery of said cover plate and reinforcing portions located along diagonal lines of said top wall portion, wherein said reinforcing portions are in the form of a ridge of a gable roof and a valley defined by tapered surfaces extending from said diagonal lines in opposite directions.

* * * * *